(12) United States Patent
Kim et al.

(10) Patent No.: US 12,107,193 B2
(45) Date of Patent: Oct. 1, 2024

(54) NANOROD TYPE MIRCO-LED, PIXEL PLATE INCLUDING THE SAME, AND DISPLAY DEVICE AND ELECTRONIC DEVICES INCLUDING THE PIXEL PLATE

(71) Applicant: SAMSUNG ELECTRONICS CO., LTD., Suwon-si (KR)

(72) Inventors: Dongho Kim, Seoul (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 330 days.

(21) Appl. No.: 17/195,121

(22) Filed: Mar. 8, 2021

(65) Prior Publication Data
US 2022/0140200 A1   May 5, 2022

(30) Foreign Application Priority Data

Nov. 5, 2020   (KR) .......................... 10-2020-0147089

(51) Int. Cl.
| | |
|---|---|
| *H01L 33/44* | (2010.01) |
| *H01L 25/075* | (2006.01) |
| *H01L 27/12* | (2006.01) |
| *H01L 33/06* | (2010.01) |
| *H01L 33/24* | (2010.01) |

(Continued)

(52) U.S. Cl.
CPC .......... *H01L 33/44* (2013.01); *H01L 25/0753* (2013.01); *H01L 27/1214* (2013.01); *H01L 33/06* (2013.01); *H01L 33/24* (2013.01); *H01L 33/38* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 7,483,212 B2 | 1/2009 | Cho et al. | |
| 9,054,259 B2 * | 6/2015 | Hwang | ................... H01L 33/16 |

(Continued)

FOREIGN PATENT DOCUMENTS

| | | |
|---|---|---|
| KR | 10-0862447 B1 | 10/2008 |
| KR | 10-2011-0117963 A | 10/2011 |

(Continued)

OTHER PUBLICATIONS

Jhih-Kai Huang et al., "Enhanced Light Extraction Efficiency of GaN-Based Hybrid Nanorods Light-Emitting Diodes", IEEE Journal of Selected Topics in Quantum Electronics, July and Aug. 2015, vol. 21, No. 4, 6000107, pp. 1-7 (7 pages total).

*Primary Examiner* — Nilufa Rahim
(74) *Attorney, Agent, or Firm* — Sughrue Mion, PLLC

(57) ABSTRACT

A nanorod type micro-light emitting diode (LED) includes a nanorod stack structure including a multi-quantum well layer and emitting light from a side surface, and a functional material layer covering the side surface of the nanorod stack structure and increasing a total internal reflection angle of the nanorod stack structure. The functional material layer has a refractive index between a refractive index of the nanorod stack structure and a refractive index of air, and includes a plurality of material layers having a refractive index distribution in which a refractive index decreases as a distance from the side surface increases.

9 Claims, 22 Drawing Sheets

(51) Int. Cl.
*H01L 33/38* (2010.01)
*H01L 33/62* (2010.01)

(56) References Cited

U.S. PATENT DOCUMENTS

| | | | | |
|---|---|---|---|---|
| 2006/0108593 | A1* | 5/2006 | Kim | H01L 33/46 |
| | | | | 257/E33.068 |
| 2012/0132944 | A1* | 5/2012 | Hsieh | H01L 33/507 |
| | | | | 257/E33.061 |
| 2013/0313583 | A1* | 11/2013 | Hwang | H01L 33/46 |
| | | | | 257/88 |
| 2014/0306252 | A1* | 10/2014 | Chen | H01L 33/58 |
| | | | | 257/98 |
| 2015/0228855 | A1 | 8/2015 | Shatalov et al. | |
| 2017/0324004 | A1* | 11/2017 | Lee | H01L 33/382 |
| 2020/0044117 | A1* | 2/2020 | Vierheilig | H01L 33/14 |
| 2020/0274330 | A1* | 8/2020 | Nagawa | H01S 5/2031 |
| 2021/0043457 | A1* | 2/2021 | Noda | H01L 21/0254 |
| 2021/0096451 | A1* | 4/2021 | Nakashima | H01S 5/11 |
| 2021/0126042 | A1* | 4/2021 | Basin | H01L 27/15 |
| 2021/0126434 | A1* | 4/2021 | Jiroku | H01S 5/187 |

FOREIGN PATENT DOCUMENTS

| | | |
|---|---|---|
| KR | 10-2014-0036403 A | 3/2014 |
| KR | 10-1383097 B1 | 4/2014 |

* cited by examiner

NANOROD TYPE MIRCO-LED, PIXEL PLATE INCLUDING THE SAME, AND DISPLAY DEVICE AND ELECTRONIC DEVICES INCLUDING THE PIXEL PLATE

CROSS-REFERENCE TO RELATED APPLICATION

This application is based on and claims priority under 35 U.S.C. § 119 to Korean Patent Application No. 10-2020-0147089, filed on Nov. 5, 2020, in the Korean Intellectual Property Office, the disclosure of which is incorporated by reference herein in its entirety.

BACKGROUND

1. Field

The disclosure relates to micro-light-emitting diodes (LEDs) and applications thereof, and more particularly, to nanorod type micro-LEDs, pixel plates including the same, and display devices and electronic devices including the pixel plates.

2. Description of Related Art

With the development of micro-light-emitting didoes (LEDs), LED displays in which pixels include micro-LEDs have been introduced. An LED display may be more excellent than an OLED display. To commercialize LED displays, mass production is essential, but there are several factors to be solved to achieve mass production. One of the factors is the increase of the light extraction efficiency (light emission efficiency) of micro-LEDs. Accordingly, various attempts to increase the light extraction efficiency of micro-LEDs have been conducted.

SUMMARY

Provided are nanorod type micro-light-emitting diodes (LEDs) that increase a total internal reflection angle for light emitted from a side of the micro-LEDs.

Provided are pixel plates including the nanorod type micro-LEDs as light-emitting devices.

Provided are display devices and electronic devices including the pixel plates.

Additional aspects will be set forth in part in the description that follows and, in part, will be apparent from the description, or may be learned by practice of the presented embodiments of the disclosure.

According to an aspect of an embodiment, a nanorod type micro-light-emitting diode (LED) includes a nanorod stack structure including a multi-quantum well layer and emitting light from a side surface, and a functional material layer covering the side surface of the nanorod stack structure and increasing a total internal reflection angle of the nanorod stack structure. The functional material layer has a refractive index between a refractive index of the nanorod stack structure and a refractive index of air, and includes a plurality of material layers having a refractive index distribution in which a refractive index decreases as a distance from the side surface increases.

The functional material layer includes a dielectric layer.

The plurality of material layers includes first to n-th material layers sequentially stacked in a direction perpendicular to the side surface of the nanorod stack structure.

The nanorod stack structure includes an n-type semiconductor layer disposed on one side of the multi-quantum well layer, and a p-type semiconductor layer disposed on another side of the multi-quantum well layer. The n-type semiconductor layer faces the p-type semiconductor layer, and the multi-quantum well layer is interposed between the n-type semiconductor layer and the p-type semiconductor layer.

The plurality of material layers includes first to n-th particle layers sequentially stacked in a direction perpendicular to the side surface of the nanorod stack structure.

The first to n-th particle layers include nanoparticles having a same size.

The first to n-th particle layers include particles of a same material, and the first to n-th particle layers have a particle distribution in which a size of the particles increases as the distance from the side surface increases.

A pixel plate includes a plurality of pixel areas, each of the plurality of pixel areas including a first subpixel including a first micro-light emitting diode (LED) configured to emit first light, a second subpixel including a second micro-LED configured to emit second light, and a third subpixel including a third micro-LED configured to emit third light. Each of the first micro-LED, the second micro-LED and the third micro-LED includes the nanorod type micro-LED, and the multi-quantum well layer of each of the first micro-LED, the second micro-LED and the third micro-LED includes a material different from one another.

Each of the first subpixel, the second subpixel and third subpixel includes two electrodes parallel to and separated from each other, and the two electrodes are connected to a respective one of the first micro-LED, the second micro-LED and the third micro-LED.

A number of micro-LEDs included in one of the first subpixel, the second subpixel and third subpixel is different from a number of micro-LEDs included in remaining ones of the first subpixel, the second subpixel and third subpixel.

The pixel plate further includes partition walls interposed between the first subpixel, the second subpixel and third subpixel.

A display device includes a backplane, a front panel facing the backplane; and a pixel plate interposed between the backplane and the front panel, and including the pixel plate.

An electronic device includes a front panel, a rear panel facing the front panel, a pixel plate interposed between the front panel and the rear panel, and including the pixel plate, and a battery in contact with the rear panel.

The electronic device further includes a communication module disposed in the rear panel, and a camera connected to the rear panel.

The electronic device further includes a main body, and bands respectively connected to both sides of the main body. The main body includes a display area including the front panel, the rear panel, the pixel plate, and the battery, and a camera, a microphone, and a speaker disposed around the display area.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
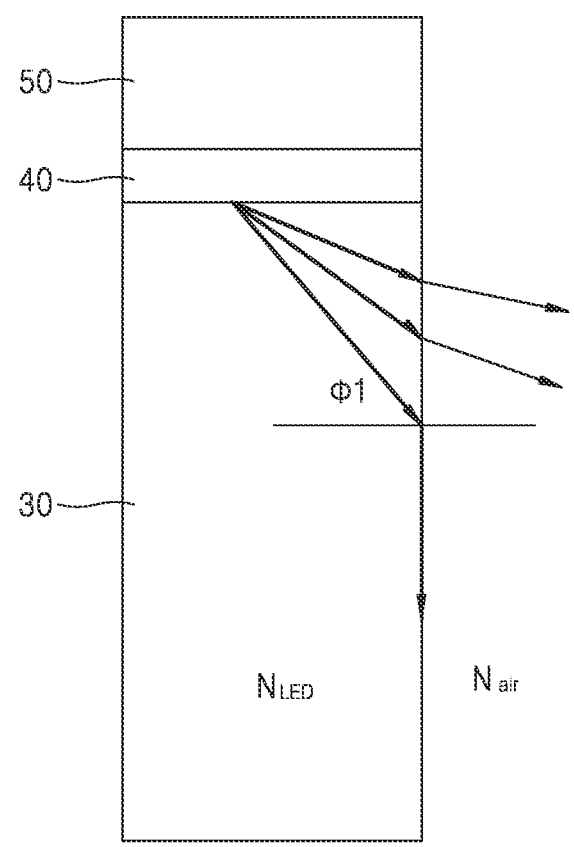
FIG. 1 is a cross-sectional view of a nanorod type micro-light-emitting diode (LED) of the related art.

Reference will now be made in detail to embodiments, examples of which are illustrated in the accompanying drawings, wherein like reference numerals refer to like elements throughout. In this regard, the embodiments may have different forms and may not be construed as being limited to the descriptions set forth herein. Accordingly, the embodiments are described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a nanorod type micro-light-emitting diode (LED) of the related art.

As shown in FIG. 1, in the nanorod type micro-LED in which a first semiconductor layer 30, an active layer 40, and a second semiconductor layer 50 are sequentially stacked, light emitted from the active layer 40 is emitted upward and downward of the active layer 40 and also emitted in a lateral direction thereof. Due to the difference between the refractive index of a micro-LED $N_{LED}$ and the refractive index of the outside of the micro-LED, for example, the refractive index $N_{air}$ of air, light emitted in the lateral direction of the micro-LED undergoes total reflection at a first angle $\phi 1$. The total reflection may be one of factors limiting the light emission efficiency or light extraction efficiency in the micro-LED.

Figure 2:
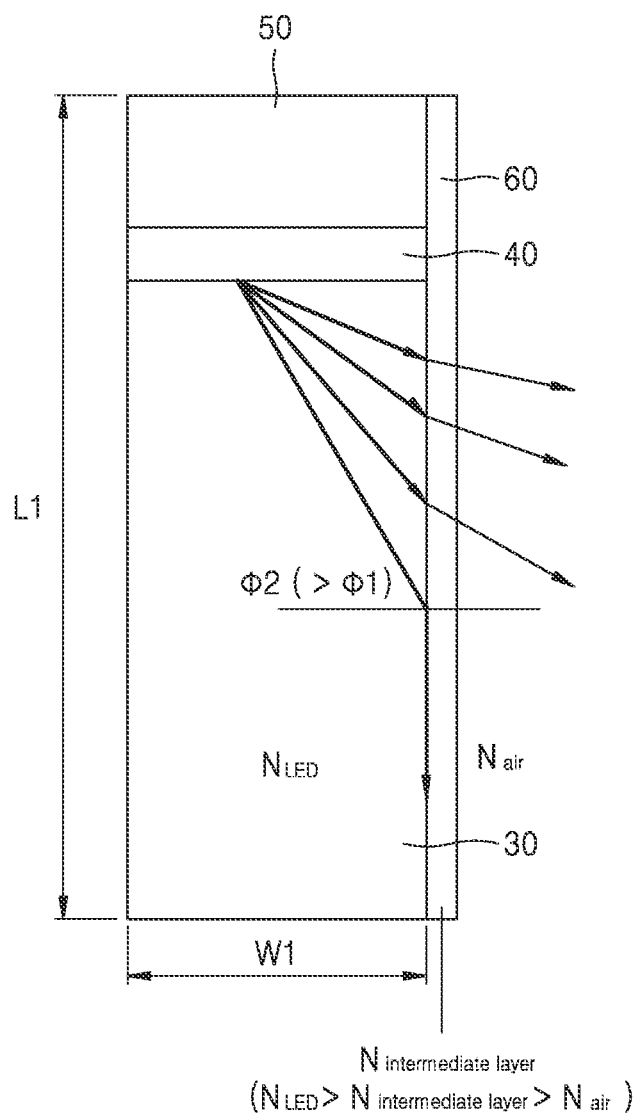
FIG. 2 is a cross-sectional view illustrating a concept of a nanorod type micro-LED according to an embodiment.

FIG. 2 is a cross-sectional view illustrating a concept of a nanorod type micro-LED according to an embodiment.

As shown in FIG. 2, when a material layer 60 having a refractive index between the refractive index $N_{LED}$ of the micro-LED and the refractive index $N_{air}$ of air is provided on a side of the micro-LED, the total reflection angle increases, and thus, light emitted in the lateral direction undergoes total reflection at a second angle $\phi 2$ greater than the first angle $\phi 1$. As a result, an amount of light emitted through a side of the micro-LED may increase compared to when the material layer 60 is not provided. That is, because the material layer 60 is provided, the light emission efficiency or the light extraction efficiency may be increased compared to when the material layer 60 is not provided.

In FIG. 2, for convenience of illustration, the material layer 60 is provided only one side of the micro-LED, but light emitted from the micro-LED may be emitted to both sides of the micro-LED. Accordingly, the material layer 60 may be disposed on both sides of the micro-LED. A micro-LED having the material layer 60 on a side thereof may be a nanorod type, and may have a length L1 greater than a width W1.

Hereinafter, embodiments of a nanorod type micro-LED having a member corresponding to the material layer 60 on a side thereof will be described in detail. The embodiments described below are illustrative technical solution to problem, and are not intended to restrict or limit the technical solution to the problem. The embodiments described below may be interpreted in various ways, and may be modified in various ways through analysis, and the scope of application thereof may be broadened. Accordingly, more solutions to the problem may be suggested from the embodiments described below.

First, a nanorod type micro-LED having a member capable of increasing light emission efficiency on a side thereof will be described, and then a pixel plate including the nanorod type micro-LED will be described. Next, a display device and electronic devices including the pixel plate described above will be described. The descriptions are made with reference to the accompanying drawings. In the drawings, thicknesses of layers or regions may be exaggerated somewhat for clarity of the specification. Also, in the drawings, like reference numerals indicate like elements throughout the specification.

A micro-LED having a nanorod type may be defined as an LED having a size of 100 μm or less. In one example, the micro-LED may be an LED having a size of 95 μm or less, and in another example, may be an LED of 90 μm or less, an LED of 80 μm or less, or an LED of 70 μm or less. The "size" may be the maximum diameter of a micro-LED in a given direction.

In a layer structure described below, when an element or layer is referred to as being "on" or "above" another element or layer, the element or layer may be directly on another element or layer or intervening elements or layers.

FIGS. 3, 4, 5, 6 and 7 are cross-sectional views of first to fifth micro-LEDs of a nanorod type according to an embodiment.

Figure 3:
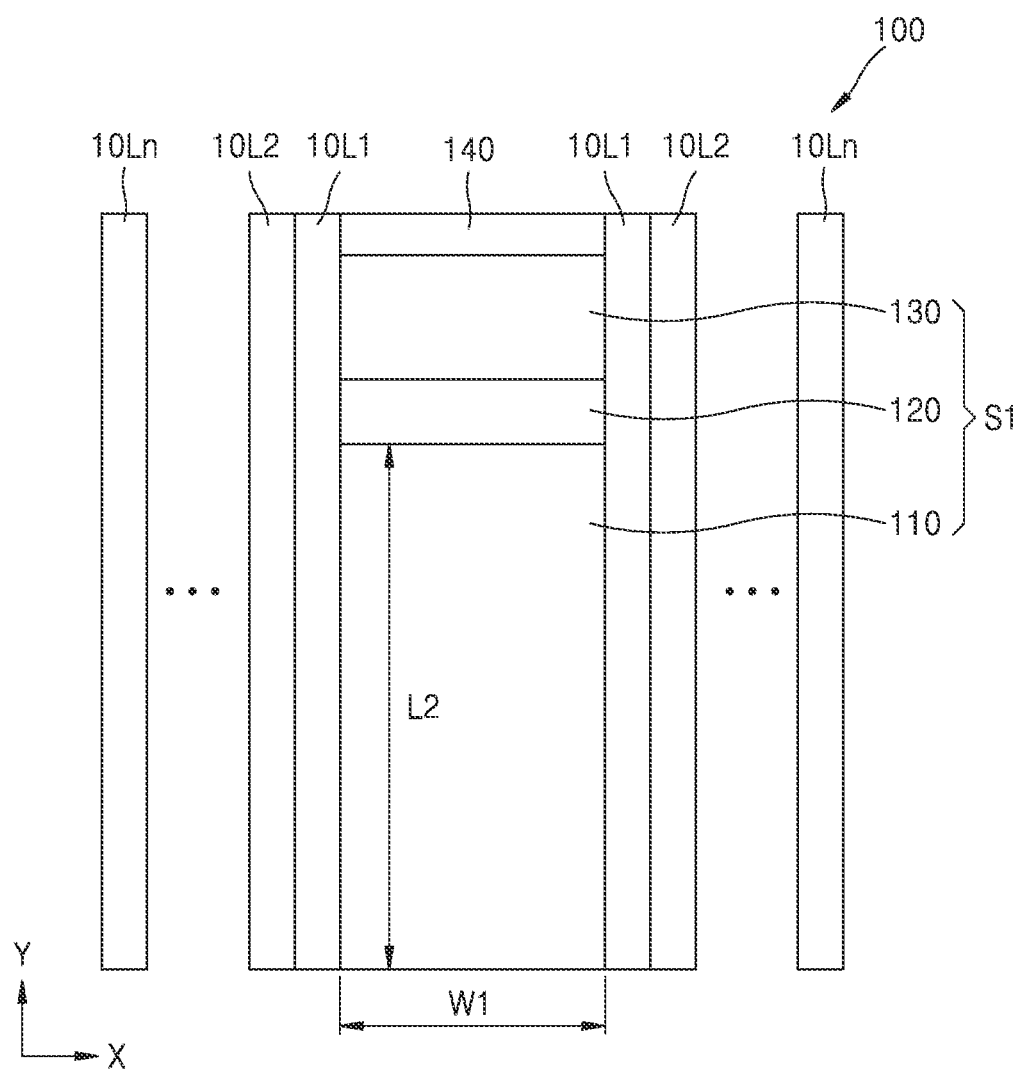
FIGS. 3, 4, 5, 6 and 7 are cross-sectional views of first to fifth micro-LEDs of a nanorod type according to an embodiment.

FIG. 3 shows a first nanorod type micro-LED 100 according to an embodiment.

Referring to FIG. 3, the first nanorod type micro-LED 100 includes a first semiconductor layer 110, an active layer 120 (a multi-quantum well layer), and a second semiconductor layer 130 sequentially stacked. A first electrode 140 is disposed on the second semiconductor layer 130, and is in contact with the first semiconductor layer 130. In one example, the first semiconductor layer 110 may be an N-type semiconductor layer or may include an N-type semiconductor layer. In one example, the N-type semiconductor layer may be a Group III-V compound semiconductor layer including an N-type dopant. In one example, the compound semiconductor layer may be a GaN layer or an AlGaInP layer, but is not limited thereto. In one example, the second semiconductor layer 130 may be a P-type semiconductor layer or may include a P-type semiconductor layer. In one example, the P-type semiconductor layer may be a Group III-V compound semiconductor layer including a P-type dopant. In one example, the compound semiconductor layer including the P-type dopant may be a GaN layer or an AlGaInP layer. The active layer 120 may be a layer that emits light due to recombination of holes and electrons, that is, a light-emitting layer. The active layer 120 may be a semiconductor layer having a multiple quantum well structure. Light of various wavelengths may be emitted from the active layer 120 according to the material of the active layer 120. For example, depending on the material of the active layer 120, the active layer 120 may be a light-emitting layer that emits red light R, green light G, or blue light B. In one example, the active layer 120 may be an InGaN layer or an AlGaInP layer, but is not limited thereto. In one example, the active layer 120 may be a single layer or a multiple layer. In one example, the active layer 120 may be a single-layer compound semiconductor layer. In another example, the active layer 120 may be a multi-layer compound semiconductor layer. When the active layer 120 is first and second compound semiconductor layers formed with an InGaN layer, the composition of each layer may be the same and the composition ratio may be different from each other. An upper surface of the first semiconductor layer 110 having a pillar-shape may be flat. Accordingly, the composition and thickness of the active layer 120 formed on the upper surface of the first semiconductor layer 110 may be uniform. The first electrode 140 may be a transparent electrode, for example, an indium tin oxide (ITO) electrode. A width W2 of the first semiconductor layer 110, the active layer 120, and the second semiconductor layer 130 constituting a nanorod in an X-axis direction may be substantially the same each other. The term 'substantially the same each other' may include all cases when values are numerically the same, when values are numerically the same within an error range, and when values are numerically outside the error range but the degree of deviation is less than a set value. The width W2 in the X-axis direction may be less than a length L2 of the first semiconductor layer 110 in the Y-axis direction. First to n-th material layers 10L1, 10L2, . . . 10Ln (n>2) are sequentially stacked in a direction parallel to the X-axis (horizontal direction) on both sides of a stack structure S1 in which the first semiconductor layer 110, the active layer 120, and the second semiconductor layer 130 are sequentially stacked. That is, the stack structure S1 is surrounded by the first to n-th material layers 10L1, 10L2, . . . 10Ln. In one example, only some of the first to n-th material layers 10L1, 10L2, . . . 10Ln may be provided on both sides of the stack structure S1. For example, only the first and second material layers 10L1 and 10L2 or the first to third material layers 10L1, 10L2, and 10L3 may be provided. The first to n-th material layers 10L1, 10L2, . . . 10Ln may be parallel to both side surfaces of the stack structure S1. The first material layer 10L1 may cover both sides of the stack structure S1 and may contact both side surfaces thereof. The first to n-th material layers 10L1, 10L2, . . . 10Ln are parallel to and may contact each other. In the first to n-th material layers 10L1, 10L2, . . . 10Ln, the first material layer 10L1 has the greatest refractive index and the n-th material layer 10Ln has the lowest refractive index. The refractive index decreases from the first material layer 10L1 to the n-th material layer 10Ln. The refractive index of each of the first to n-th material layers 10L1, 10L2, . . . 10Ln is less than those of the first semiconductor layer 110, the active layer 120, and the second semiconductor layer 130, but may be greater than the refractive index of a surrounding medium, for example, a fluid medium (e.g., air). The first material layer 10L1 may also protect both side surfaces of the stack structure S1. In one example, the thicknesses of the first to n-th material layers 10L1, 10L2, . . . 10Ln may be the same or different from each other. In one example, materials of two adjacent material layers in the first to n-th material layers 10L1, 10L2, . . . 10Ln may be different from each other. The first to n-th material layers 10L1, 10L2, . . . 10Ln may be material layers that do not have transfer characteristics of carriers, such as electrons or holes when a voltage for driving the micro-LED is applied. In one example, the first to n-th material layers 10L1, 10L2, . . . 10Ln may be dielectric layers. For example, the first to n-th material layers 10L1, 10L2, . . . 10Ln may include one of polystyrene, hafnium oxide (e.g., $HfO_2$), aluminum oxide (e.g., $Al_2O_3$), or silicon oxide (e.g., $SiO_2$). In one example, two adjacent material layers selected from among the first to n-th material layers 10L1, 10L2, . . . 10Ln may include two different material layers selected from among a polystyrene layer, a hafnium oxide layer, an aluminum oxide layer, and a silicon oxide layer. In one example, the thickness of each of the first to n-th material layers 10L1, 10L2, . . . 10Ln may be in a range from about 1 nm to about 1 μm, 500 nm or less or 100 nm or less.

The first to n-th material layers 10L1, 10L2, . . . 10Ln may be regarded as refractive index change layers in which the refractive index changes (lowers) outward in the stack structure S1. In addition, because the first to n-th material layers 10L1, 10L2, . . . 10Ln are provided, light extraction or light emission to the side of the stack structure S1 increases, thus, the refractive index change layer may be referred to as a layer that increases light extraction. From another viewpoint, the first to n-th material layers 10L1, 10L2, . . . 10Ln have an intermediate refractive index between that of the stack structure S1 and that of a surrounding fluid (e.g., air), and thus, may be regarded as light extraction inducing layers that induce light emission or light extraction to the side of the micro-LED.

As described above, because the first to n-th material layers 10L1, 10L2, . . . 10Ln are provided on side surfaces of the first nanorod type micro-LED 100, a gradient of the refractive index between the micro-LED and the outside thereof may be mitigated. Accordingly, a total internal reflection angle of light emitted through the side of the micro-LED is increased than when the first to n-th material layers 10L1, 10L2, . . . 10Ln are absent. Therefore, when the first to nth material layers 10L1, 10L2, . . . 10Ln are disposed, an amount of light that may be emitted through the side of the micro-LED among light incident on the side from inside of the micro-LED may be increased than before the first to n-th material layers 10L1, 10L2, . . . 10Ln are arranged. In this respect, it may be said that the first to n-th material layers 10L1, 10L2, . . . 10Ln may act as a means or member for increasing the total internal reflection angle of light generated inside the micro-LED.

Figure 4:
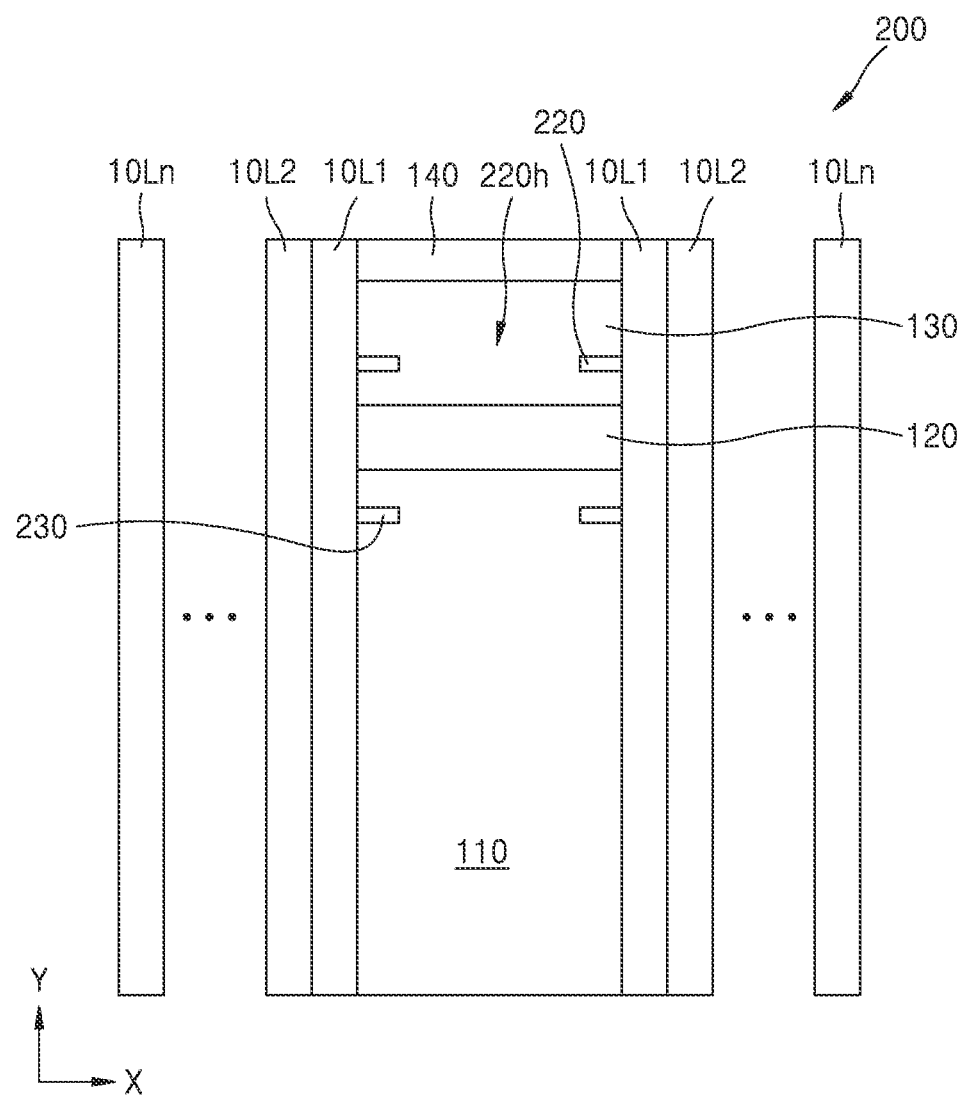

FIG. 4 shows a second nanorod type micro-LED 200 according to an embodiment. Only parts different from the first nanorod type micro-LED 100 of FIG. 3 will be described.

Referring to FIG. 4, a first barrier layer 220 configured to partially limit or block the flow or inflow of carriers is provided above the active layer 120. The first barrier layer 220 is disposed between the active layer 120 and the first electrode 140, in other words, between the active layer 120 and an upper surface of the second semiconductor layer 130. The first barrier layer 220 is located close to the active layer 120, but does not contact the active layer 120. The first barrier layer 220 corresponds to an edge portion of the active layer 120. The first barrier layer 220 may have a through hole 220h or an opening in a central region thereof. Accordingly, in the cross-sectional view of FIG. 4, the first barrier layer 220 is shown as two parts separated from each other. The through hole 220h of the first barrier layer 220 is located above a central region of the active layer 120 and corresponds to the central region of the active layer 120. Accordingly, among first carriers (e.g., holes) flowing into the active layer 120 through the second semiconductor layer 130, carriers having a high possibility of leakage toward an edge portion of the active layer 120 may be blocked by the first barrier layer 220. Accordingly, light emission from the active layer 120 may mostly occur in the central region of the active layer 120. The first barrier layer 220 may include a first oxide layer, for example, a layer in which oxygen (O) is bonded to $Al_xGa_{1-x}As(0<x<1)$, but is not limited thereto. A second barrier layer 230 is provided under the active layer 120. The second barrier layer 230 is arranged in the first semiconductor layer 110. Like the first barrier layer 220, the second barrier layer 230 may be in a buried shape. The role of the second barrier layer 230 may be the same as that of the first barrier layer 220 in that the second barrier layer 230 limits or blocks a part of the carriers flowing through the first semiconductor layer 110 to the active layer 120. However, the second barrier layer 230 limits or blocks second carriers (e.g., electrons) different from the first carrier. The second barrier layer 230 may be disposed to face the first barrier layer 220 with the active layer 120 as the center. The provided locations of first and second barrier layers 220 and 230 are different from each other, but they may have the same shape. In one example, the second barrier layer 230 may include a second oxide layer. The second oxide layer may be the same as or different from the first oxide layer.

Figure 5:
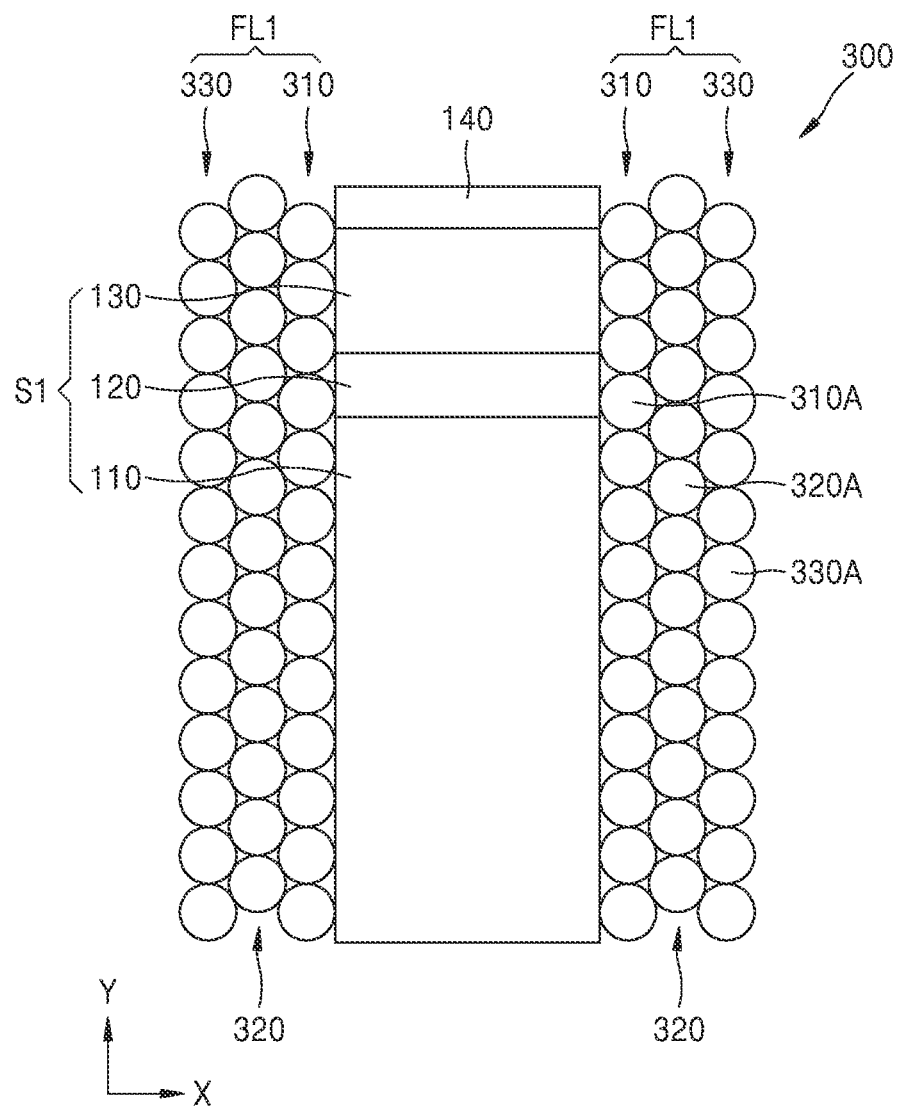

FIG. 5 shows a third nanorod type micro-LED 300 according to an embodiment. Only parts different from the first nanorod type micro-LED 100 of FIG. 3 will be described.

Referring to FIG. 5, both side surfaces of the stack structure S1 are covered with a first functional material layer FL1. The first functional material layer FL1 covers an entire side surface of the stack structure S1. A side surface of the first electrode 140 may also be covered with the first functional material layer FL1. The first functional material layer FL1 may be a material layer that increases or enhances light extraction of the third nanorod type micro-LED 300. In other words, the first functional material layer FL1 may be a material layer that increases or enhances light emission of the third nanorod type micro-LED 300. Because the first functional material layer FL1 is provided, light extraction efficiency or light emission efficiency of the third nanorod type micro-LED 300 may be increased. The refractive index of the first functional material layer FL1 is less than that of the stack structure S1, and is greater than that of a medium, for example, a fluid (e.g., air) surrounding the third nanorod type micro-LED 300. The first functional material layer FL1 may include a plurality of particle layers. In one example, the first functional material layer FL1 may include first to third particle layers 310, 320, and 330, and in another example, may include the first and second particle layers 310 and 320. The first particle layer 310 includes a plurality of first particles 310A. The plurality of first particles 310A are arranged in a direction parallel to a side surface of the stack structure S1 (Y-axis direction), and are in contact with each other. The plurality of first particles 310A may directly contact the side surface of the stack structure S1. The second particle layer 320 includes a plurality of second particles 320A. The plurality of second particles 320A are arranged parallel to the first particle layer 310. The plurality of second particles 320A may contact each other. Each of the plurality of second particles 320A in the X-axis direction may not be located on the plurality of first particles 310A, but may be located between the plurality of first particles 310A. The third particle layer 330 includes a plurality of third particles 330A. The plurality of third particles 330A may be arranged in the Y-axis direction and be in contact with each other. The plurality of third particles 330A may be arranged parallel to the second particle layer 320. In the X-axis direction, the plurality of third particles 330A may be located between the plurality of second particles 320A and may be located on the plurality of first particles 310A. In one example, the plurality of first to third particles 310A, 320A, and 330A may be nanoparticles, and a diameter of each of the plurality of first to third particles 310A, 320A, and 330A may be in a range from about 1 nm to about 1 μm. In one example, the diameter of each of the plurality of particles 310A, 320A, and 330A may be 500 nm or less or 100 nm or less. In this range of diameters, the diameters of the plurality of first to third particles 310A, 320A, and 330A may be the same. In one example, a material of the plurality of first to third particles 310A, 320A, and 330A may be polystyrene, hafnium oxide, aluminum oxide, or silicon oxide. The refractive index of the first particle 310A is the greatest, and the refractive index of the third particle 330A is the lowest. When the first functional material layer FL1 is the first to n-th particle layers (n>2), the refractive index of the first particle layer 310 closest to the side surface of the stack structure S1 is the greatest, and the refractive index of the n-th particle layer farthest from the side surface of the stack structure S1, that is, the outermost particle layer is the lowest. However, the refractive index of the n-th particle layer is also higher than that of a medium, for example, a fluid (eg, air) surrounding the third micro-LED 300.

The first to third particle layers 310, 320, and 330 may be arranged parallel to the side surfaces of the stack structure S1. The first to third particle layers 310, 320, and 330 may be parallel to each other. The first to third particle layers 310, 320, and 330 are sequentially stacked in a direction perpendicular to the side of the stack structure S1, that is, a horizontal direction (a direction parallel to the X-axis). The first particle layer 310 may cover the entire side surface of the stack structure S1 and contact the side surface thereof. In another embodiment, a protective material layer may be provided between the first particle layer 310 and the stack structure S1. The protective material layer may cover and protect the side surface of the stack structure S1.

Figure 6:
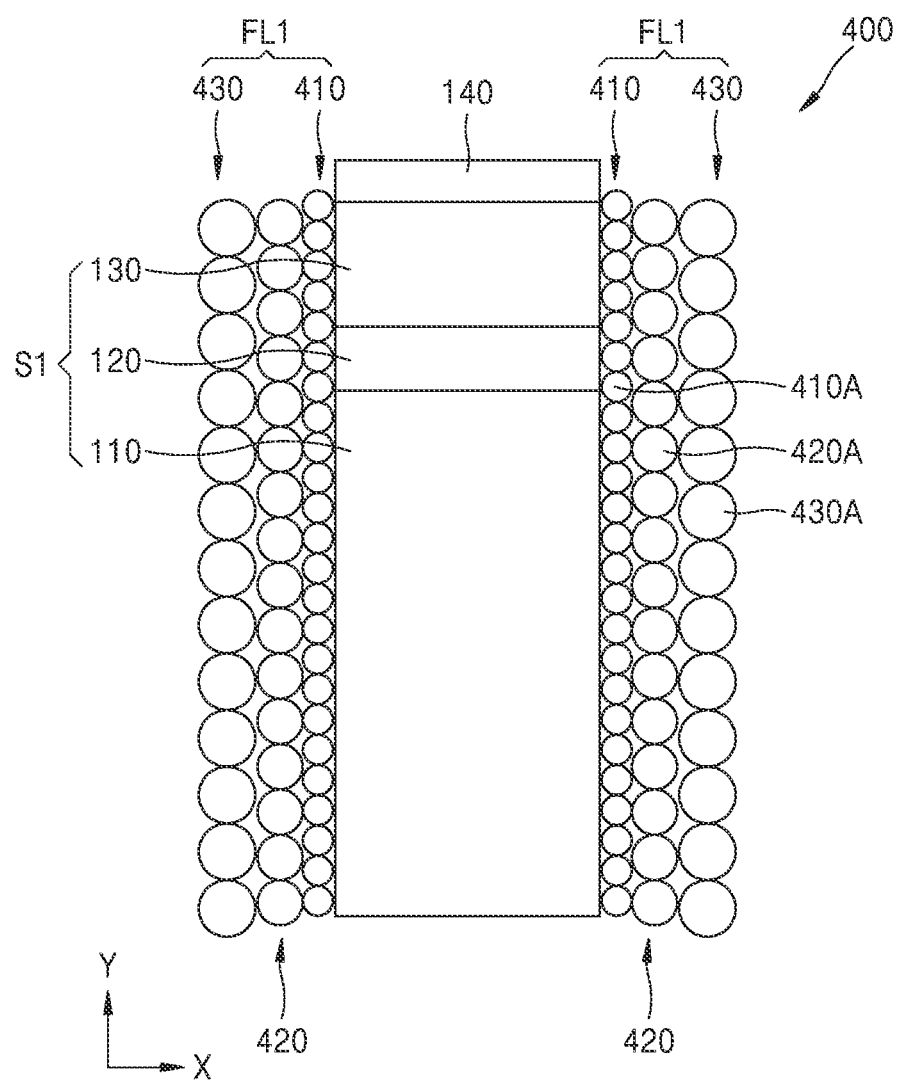

FIG. 6 shows a fourth nanorod type micro-LED 400 according to an embodiment. Only parts different from the third nanorod type micro-LED 300 of FIG. 5 will be described.

Referring to FIG. 6, the fourth nanorod type micro-LED 400 includes a second functional material layer FL2 covering a side surface of the stack structure S1. The function of the second functional material layer FL2 may be the same as that of the first functional material layer FL1 described with reference to FIG. 5. The layer configuration of the second functional material layer FL2 may be the same as the layer configuration of the first functional material layer FL1 of the third micro-LED 300 in that the second functional material layer FL2 includes a plurality of particle layers 410, 420, and 430. However, sizes of particles 410A, 420A, and 430A included in the first to third particle layers 410, 420, and 430 of the second functional material layer FL2 are different from each other. Like the particles 310A, 320A, and 330A included in the first functional material layer FL1, the plurality of particles 410A, 420A, and 430A included in the second functional material layer FL2 may also have a spherical shape or a shape close to a spherical shape. When reviewing the sizes of the particles 410A, 420A, and 430A included in the second functional material layer FL2, the size of the first particles 410A included in the first particle layer 410 is the smallest, and the size of the third particles 430A included in the 3 particle layer 430 that is the outermost layer is the greatest. In this way, the particles 410A, 420A, and 430A included in the second functional material layer FL2 are arranged such that the size of the first particles 410A included in the first particle layer 410 closest to a side surface of the stack structure S1, that is, the innermost layer is the smallest, and the sizes of the particles 410A, 420A, and 430A increases as a distance from the side surface of the stack structure S1 increases. Accordingly, the closer to the side surface of the stack structure S1, the particle density of the particle layer increases, and the further away from the side surface, the particle density of the particle layer decreases. That is, the particle density of the first particle layer 410 is higher than that of the second particle layer 420, and the particle density of the second particle layer 420 is higher than the particle density of the third particle layer 430.

Figure 7:
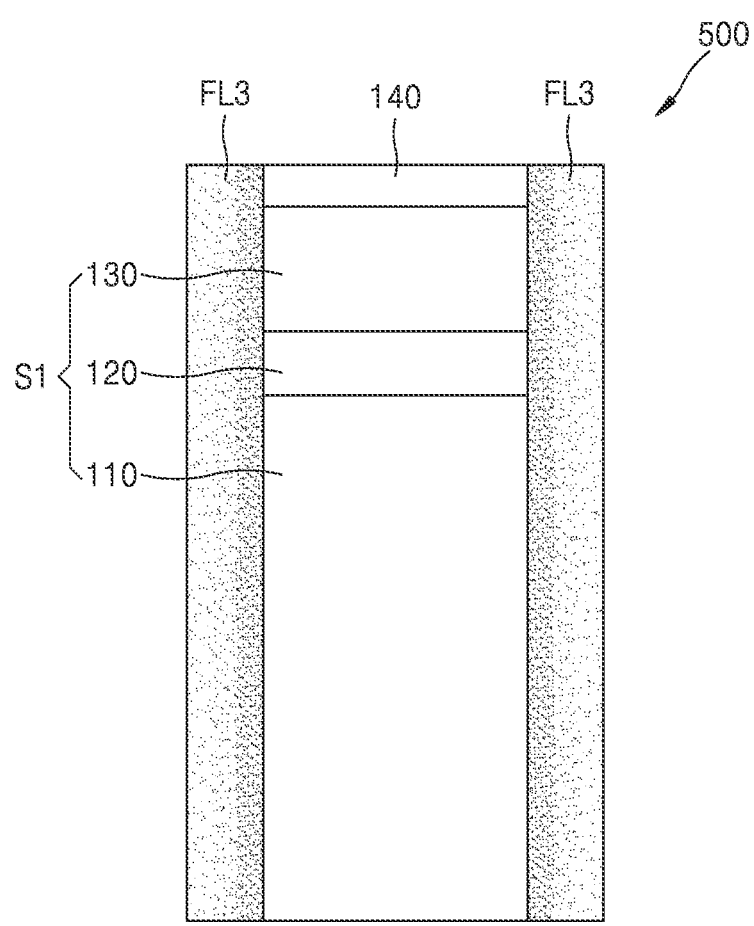

FIG. 7 shows a fifth nanorod type micro-LED 500 according to an embodiment.

Referring to FIG. 7, a side surface of the stack structure S1 is covered with a third functional material layer FL3. The third functional material layer FL3 may surround an entire side surface of the stack structure S1, and may directly contact the side surface thereof. The third functional material layer FL3 may be a single layer. A side surface of the first electrode 140 may also be covered with a third functional material layer FL3. The third functional material layer FL3 may have a gradient of refractive index. As an example, the refractive index of the third functional material layer FL3 may decrease from an inner side that is in contact with the side surface of the stack structure S1 to an outer side. The maximum refractive index of the third functional material layer FL3 is lower than the refractive index of the stack structure S1. The minimum refractive index in the third functional material layer FL3 is greater than the refractive index of a medium, in one example, a fluid (e.g., air) surrounding the fifth nanorod type micro-LED 500.

Simulation

Next, when a material layer that increases light extraction efficiency or light emission efficiency is provided on the side of the stack structure S1 as in the case of the first to fifth nanorod type micro-LEDs 100, 200, 300, 400, and 500, simulations performed to verify the effect of increasing light extraction (light emission) according to material and thickness of the material layer will be described.

FIGS. 8, 9, 10, 11 and 12 are graphs showing first to fifth simulation results.

FIGS. 8 to 12 show results of simulations performed under various conditions.

In all simulations, AlGaInP was used as the material of the stack structure S1, that is, the first semiconductor layer 110, the active layer 120, and the second semiconductor layer 130. In all simulations, a wavelength of light emitted from the stack structure S1 was set to 630 nm. The simulation was performed 5 times.

The first to third simulations were conducted as follows.

A material layer covering the side surfaces of the stack structure S1 was formed as a single layer. Each simulation was performed by measuring light emitted from the side of the stack structure S1 while changing the thickness of the single layer under a condition that the material of the single layer is polystyrene (1.59), $HfO_2$ (2.10), or $Al_2O_3$ (1.76) having different refractive indices, and the measured results were compared with the result measured without the single layer. The number in parentheses of the single layer material is the refractive index of the material with respect to light having a wavelength of 630 nm.

The 4th and 5th simulations were performed as follows.

Light emitted from the side of the stack structure S1 was measured while changing the thickness of a $SiO_2$ layer under a condition that a material layer covering the side of the stack structure S1 is two single layers, that is, first and second material layers sequentially stacked, and one of the first and second material layers is an $Al_2O_3$ layer and the other one is a $SiO_2$ layer (1.457), and the measurement results were compared with the measurement result when there was no material layer covering the side surface of the stack structure S1. In the fourth and fifth simulations, the thickness of the $Al_2O_3$ layer was maintained at 150 nm.

Figure 8:
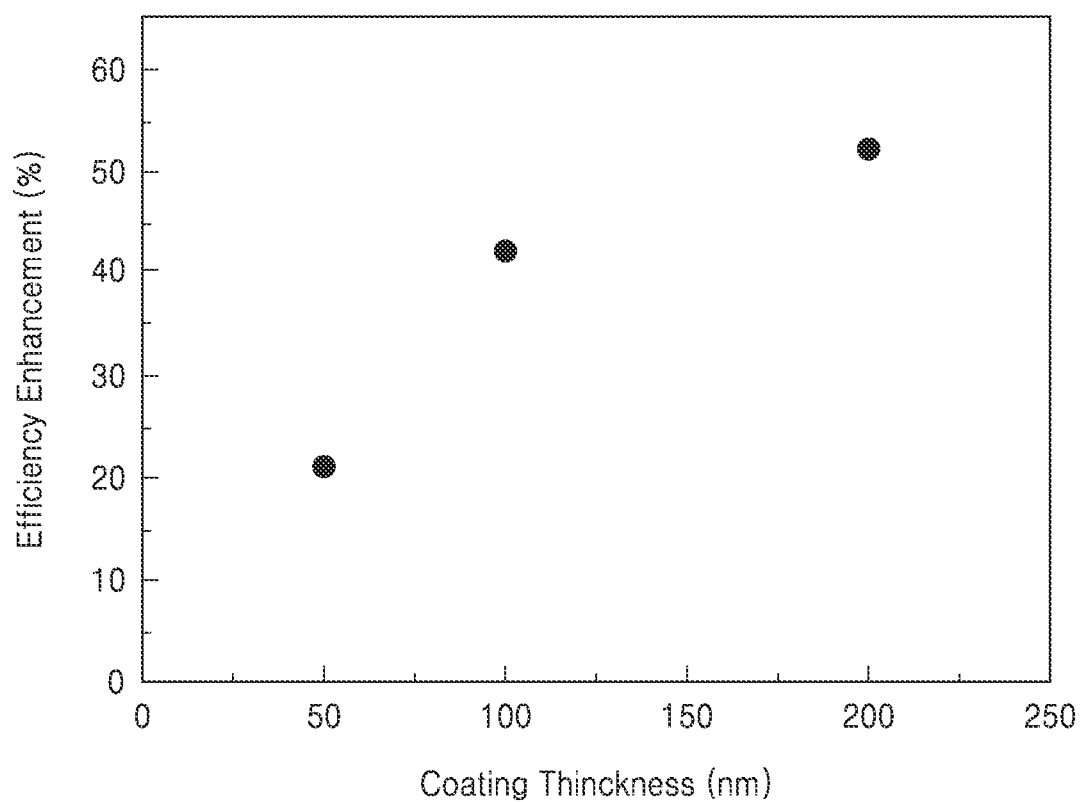
FIGS. 8, 9, 10, 11 and 12 are graphs showing first to fifth simulation results.

FIG. 8 shows a result of the first simulation, that is, how much the light extraction efficiency increases when a polystyrene layer is present as a single material layer on the side surface of the stack structure S1 than when the single material layer is not present. The horizontal axis represents the change in the thickness of the single material layer (polystyrene layer) covering the side surface of the stack structure S1, and the vertical axis represents the light extraction efficiency enhancement.

Referring to FIG. 8, it may be seen that the light extraction efficiency increases as the thickness of the polystyrene layer increases.

Figure 9:
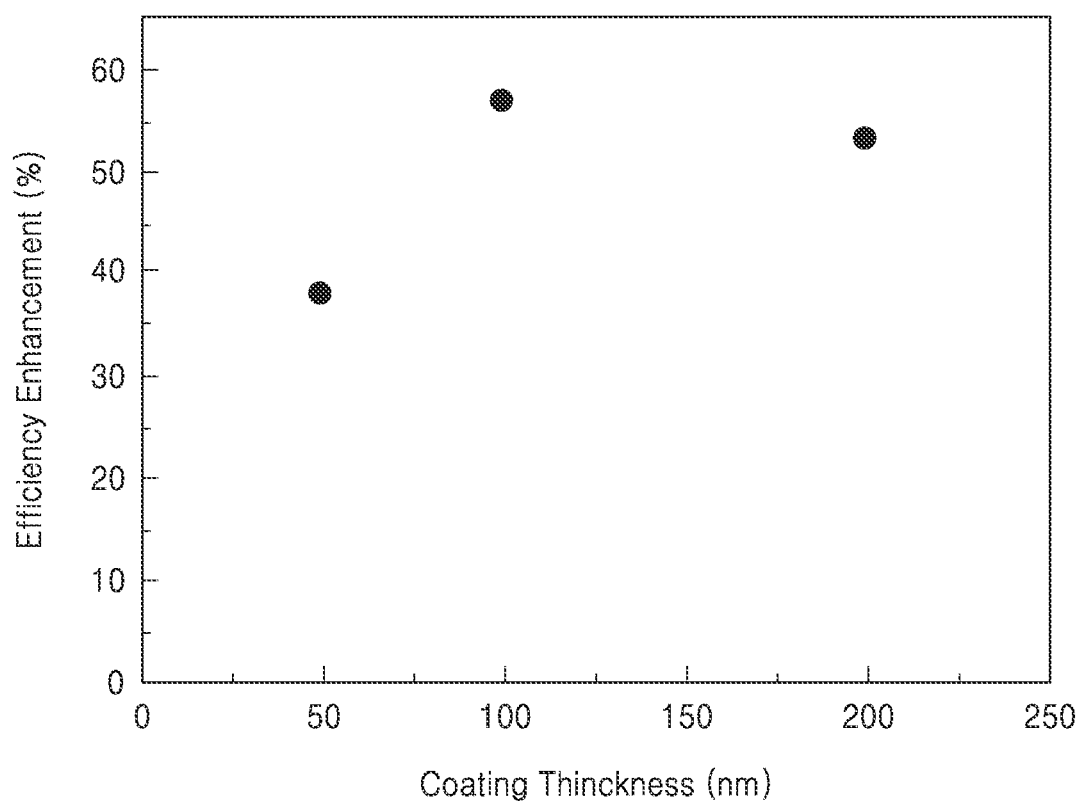

FIG. 9 shows a result of the second simulation, that is, how much the light extraction efficiency increases when a single material layer ($HfO_2$ layer) is present on the side of the stack structure S1 than when the single material layer is not present. The horizontal axis represents the change in the thickness of the single material layer covering the side surface of the stack structure S1, and the vertical axis represents the light extraction efficiency enhancement.

Referring to FIG. 9, when the thickness of the $HfO_2$ layer is 100 nm or less, the light extraction efficiency increases as the thickness of the $HfO_2$ layer increases. As the thickness continues to increase, the proportionality is not maintained, but even at a thickness of 100 nm or more, the light extraction efficiency is greater than the minimum value of the light extraction efficiency when the thickness is 100 nm or less.

Figure 10:
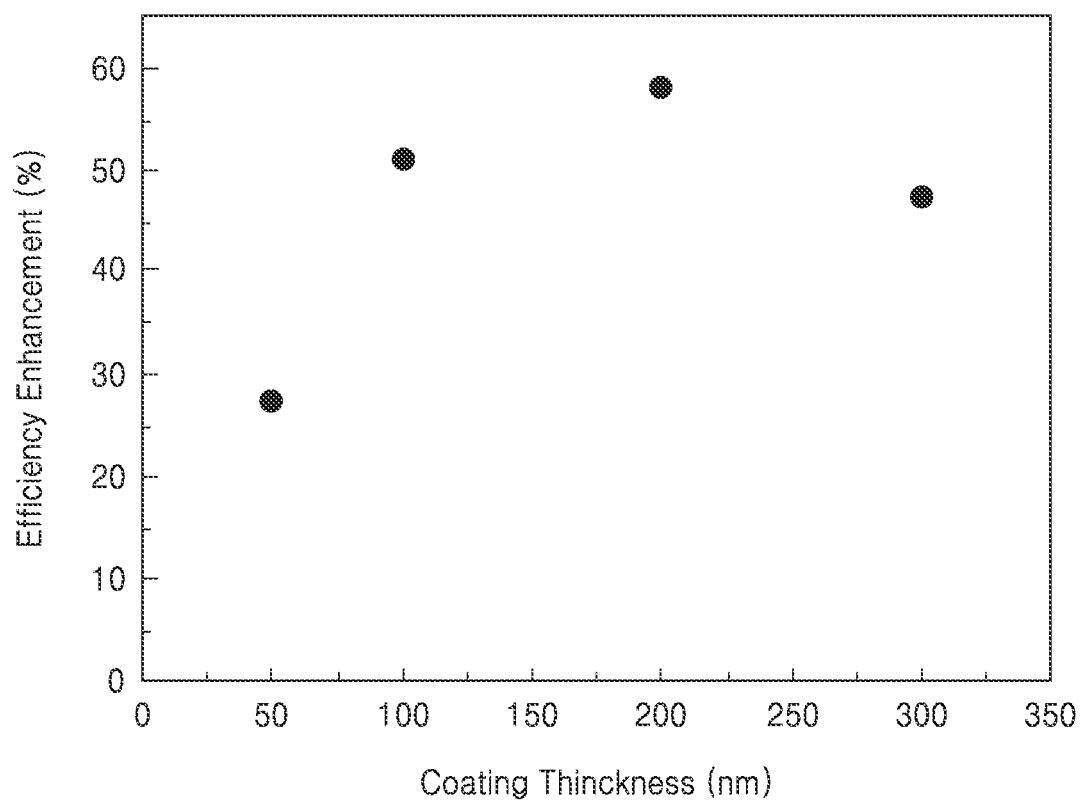

As a result of the third simulation, FIG. 10 shows how much the light extraction efficiency increases when an $Al_2O_3$ layer exists as a single material layer on the side of the stack structure S1 than when there is no the single material layer. The horizontal axis represents the change in the thickness of the single material layer covering the side surface of the stack structure S1, and the vertical axis represents the light extraction efficiency enhancement.

Referring to FIG. 10, the light extraction efficiency increases as the thickness of the $Al_2O_3$ layer increases at a thickness of 200 nm or less. As the thickness increases beyond 200 nm, the light extraction efficiency does not continue to increase, but even at a thickness of 200 nm or more, the light extraction efficiency is greater than the minimum value of the light extraction efficiency when the thickness is 200 nm or less.

Figure 11:
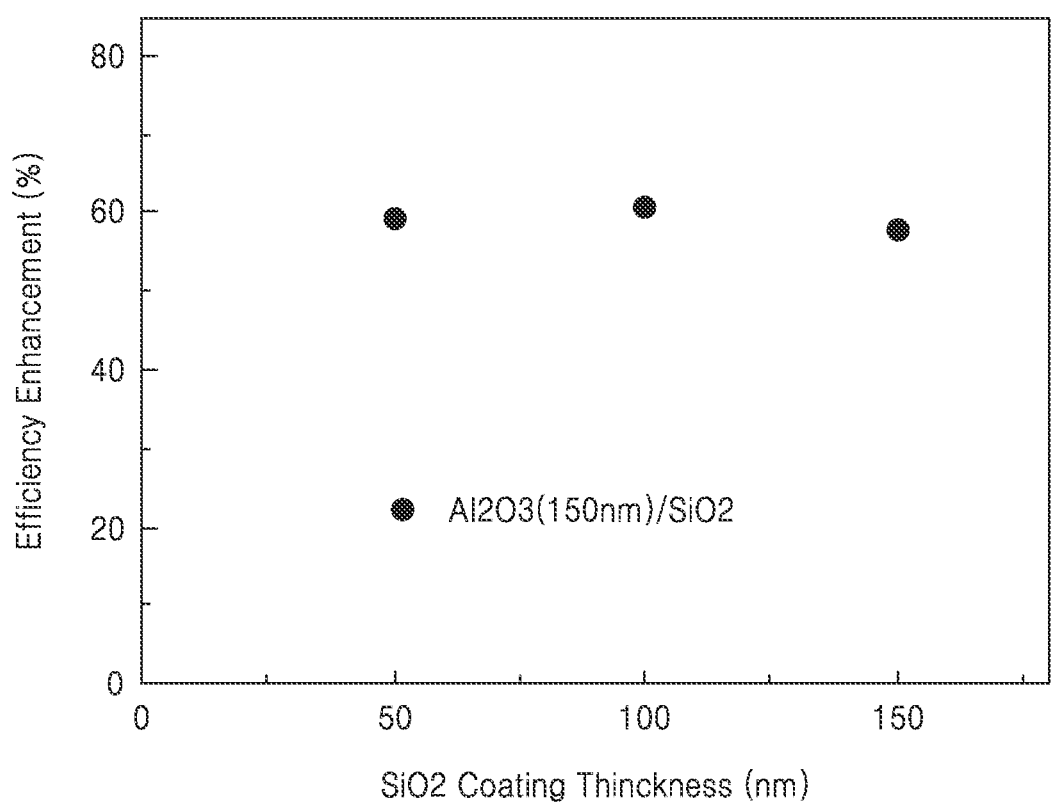

As a result of the fourth simulation, FIG. 11 shows how much the light extraction efficiency increases when the material layer covering the side surfaces of the stack structure S1 is two single layers sequentially stacked (a $SiO_2$ layer is stacked on an $Al_2O_3$ layer) than when there is no the material layer. The horizontal axis represents the change in the thickness of the $SiO_2$ layer, and the vertical axis represents the light extraction efficiency enhancement.

Referring to FIG. 11, it may be seen that the light extraction efficiency is increased by about 60% regardless of the change in the thickness of the $SiO_2$ layer.

Figure 12:
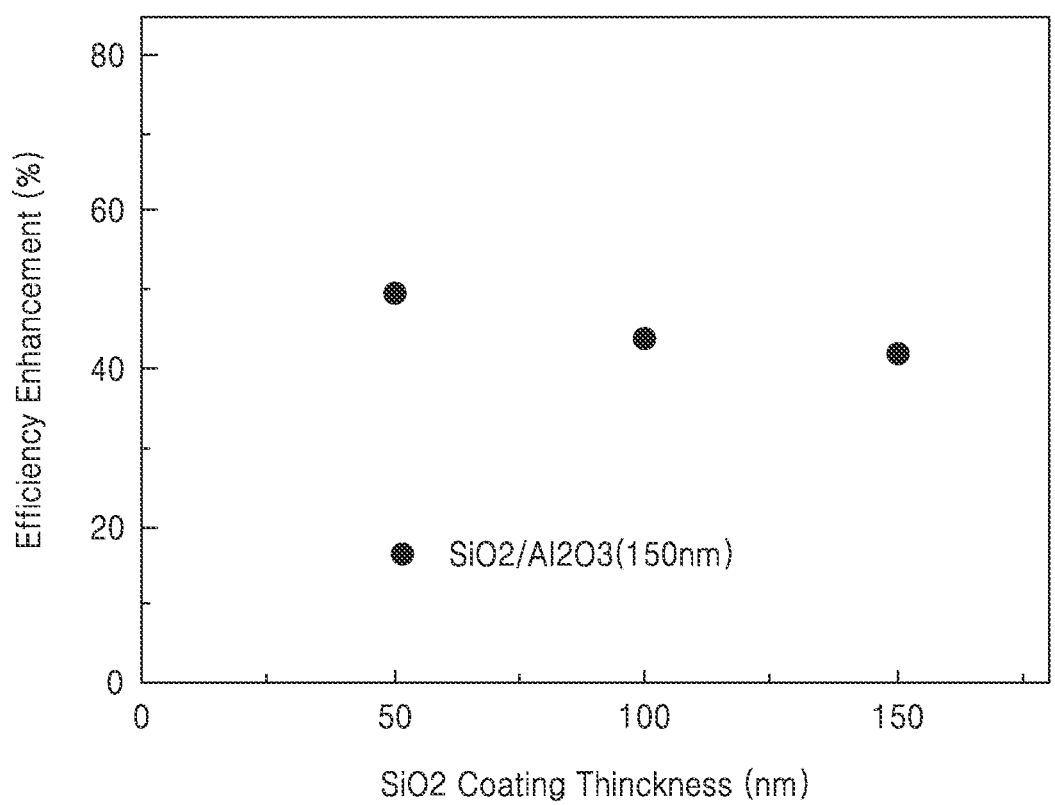

As a result of the fifth simulation, FIG. 12 shows how much the light extraction efficiency increases when the material layer covering the side surfaces of the stack structure S1 is two single layers sequentially stacked (an $Al_2O_3$ layer is stacked on a $SiO_2$ layer) than when there is no the material layer. The horizontal axis represents the change in the thickness of the $SiO_2$ layer, and the vertical axis represents the light extraction efficiency enhancement.

Referring to FIG. 12, as the thickness of the $SiO_2$ layer increases from 50 nm to 150 nm, the degree of increase in light extraction efficiency is slightly lowered, but the light extraction efficiency is maintained at about 40% increased state even at a thickness of 150 nm.

Another member that may stabilize the operation of a micro-LED, help in stable light emission, or increase in light emission efficiency may further be arranged between the first semiconductor layer 110, the active layer 120, and the second semiconductor layer 130 of the first to fifth nanorod type micro-LEDs 100, 200, 300, 400, and 500 described above.

Figure 13:
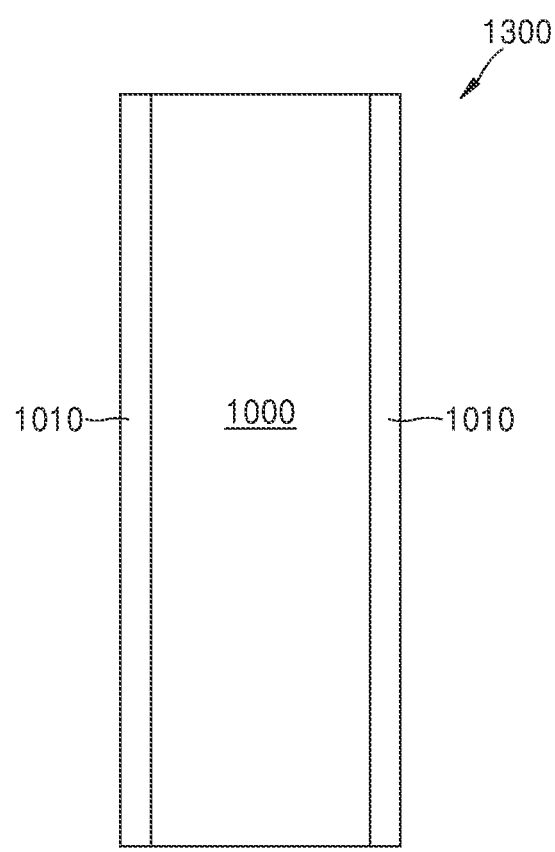
FIG. 13 is a cross-sectional view showing an equivalent micro-LED of first to fifth micro-LEDs of a nanorod type according to an embodiment.

FIG. 13 is a cross-sectional view showing an equivalent micro-LED of first to fifth micro-LEDs of a nanorod type according to an embodiment.

FIG. 13 shows an equivalent micro-LED 1300 of the first to fifth nanorod type micro-LEDs 100, 200, 300, 400, and 500 described above.

The equivalent micro-LED 1300 includes a nanorod 1000 and an outer cover layer 1010 covering a side surface thereof. The nanorod 1000 may correspond to the stack structure S1 of the first to fifth nanorod type micro-LEDs 100, 200, 300, 400, and 500. The outer cover layer 1010 may correspond to the members 10L1 to 10Ln and FL1 to FL3 covering the side surfaces of the stack structure S1 of the first to fifth nanorod type micro-LEDs 100, 200, 300, 400 and 500.

From now on, the equivalent micro-LED 1300 is used in place of the first to fifth nanorod type micro-LEDs 100, 200, 300, 400, and 500, and the expression 'equivalent' will be omitted and will be referred to as the micro-LED 1300. The micro-LED 1300 may emit red, green, or blue light.

The micro-LED 1300 may be applied to various fields and devices, which will be described below.

Figure 14:
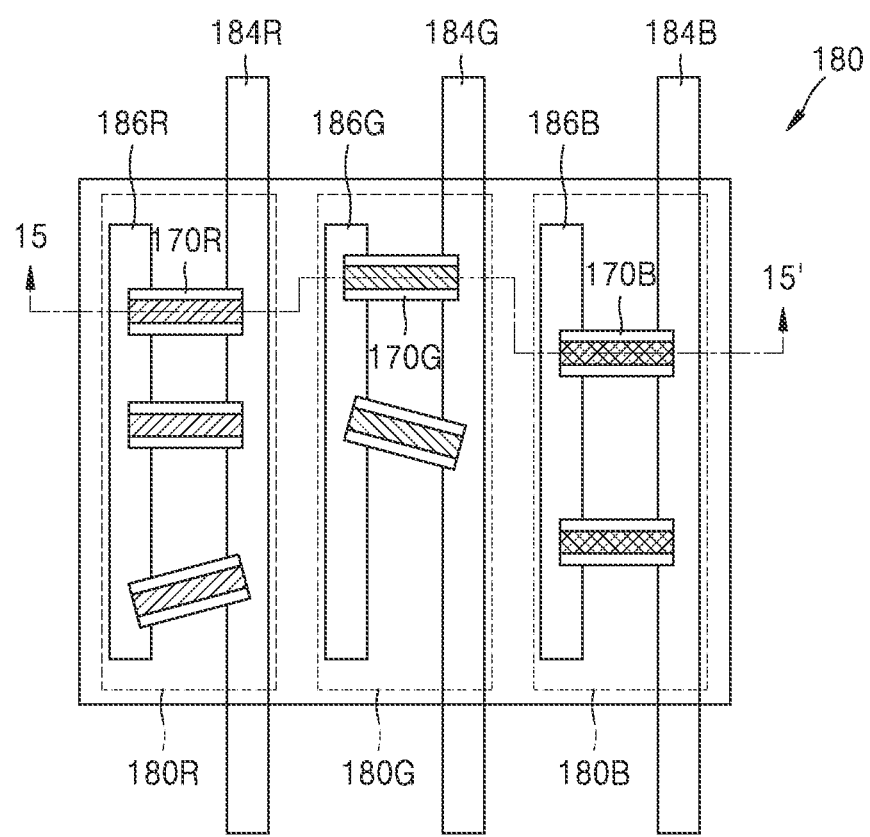
FIG. 14 is a plan view showing a unit pixel including a nanorod type micro-LED according to an embodiment, represented by the equivalent micro-LED of FIG. 13.

FIG. 14 is a plan view showing a display device 180 including a nanorod type micro-LED according to an embodiment, represented by the equivalent micro-LED 1300 of FIG. 13. The display device 180 of FIG. 14 is seen at a level of one pixel.

Referring to FIG. 14, the display device 180 may be a television (TV) or portable electronic devices capable of displaying an image.

Referring to FIG. 14, the display device 180 includes first to third subpixels 180R, 180G, and 180B. The first to third subpixels 180R, 180G, and 180B are arranged parallel to each other. In an example, the first subpixel 180R may be a subpixel that emits red light R, the second subpixel 180G may be a subpixel that emits green light G, and the third subpixel 180B may be a subpixel that emits blue light B. The first subpixel 180R include a first electrode 186R and a first common electrode 184R that are separated from and parallel to each other. The second subpixel 180G includes a second electrode 186G and a second common electrode 184G that are separated from and parallel to each other. The third subpixel 180B includes a third electrode 186B and a third common electrode 184B that are separated from and parallel to each other. The first to third common electrodes 184R, 184G, and 184B may be extended to other adjacent pixels. A first micro-LED 170R is disposed between the first electrode 186R and the first common electrode 184R of the first subpixel 180R. Although three first micro-LEDs 170R are disposed between the first electrode 186R and the first common electrode 184R, the number of the first micro-LEDs 170R disposed between the first electrode 186R and the first common electrode 184R may be one or more. The first micro-LED 170R may be the micro-LED 1300 of FIG. 13. In one example, the first micro-LED 170R may be a micro-LED that emits red light. One side (e.g., a portion corresponding to a P-type semiconductor layer) of the first micro-LED 170R is connected to the first common electrode 184R, and the other side (e.g., a portion corresponding to an N-type semiconductor layer) is connected to the first electrode 186R. The connection between the first micro-LED 170R and the first electrode 186R and the first common electrode 184R may be achieved through metallization. A second micro-LED 170G is disposed between the second electrode 186G and the second common electrode 184G of the second subpixel 180G. The second micro-LED 170G may be the micro-LED 1300 of FIG. 13. In one example, the second micro-LED 170G may have the same layer structure or shape as the first micro-LED 170R except for emitting green light. Two second micro-LEDs 170G are arranged between the second electrode 186G and the second common electrode 184G, but the number of the second micro-LEDs 170G is not limited thereto, that is, one or more second micro-LEDs 170G may be arranged. The connection relationship between the second micro-LED 170G and the second electrode 186G and the second common electrode 184G may be the same as the connection relationship between the first micro-LED 170R and the first electrode 186R and the first common electrode 184R.

In the third subpixel 180B, a third micro-LED 170B is disposed between the third electrode 186B and the third common electrode 184B. Although two third micro-LEDs 170B are disposed in the third subpixel 180B, the number of third micro-LEDs 170B is not limited thereto, that is, one or more (e.g., three, four, or five or more) may be disposed. The third micro-LED 170B may be the same as the micro-LED 1300 of FIG. 13. In one example, the third micro-LED 170B may have the same layer structure or shape as the first and second micro-LEDs 170R and 170G except for emitting blue light. The connection relationship between the third micro-LED 170B and the third electrode 186B and the third common electrode 184B may be the same as the connection relationship between the first micro-LED 170R and the first electrode 186R and the first common electrode 184R.

The first to third common electrodes 184R, 184G, and 1846 may include a reflective material to reflect light emitted from the first to third micro-LEDs 170R, 170G, and 170B upward. For example, the first to third common electrodes 184R, 184G, 184B may include Ag, Au, Al, Cr, Ni, or an alloy of these materials.

The first to third common electrodes 184R, 184G, and 184B may be ground lines. Also, partition walls 194 (refer to FIG. 15) for preventing optical interference may be provided between the first to third subpixels 180R, 180G, and 180B.

Figure 15:
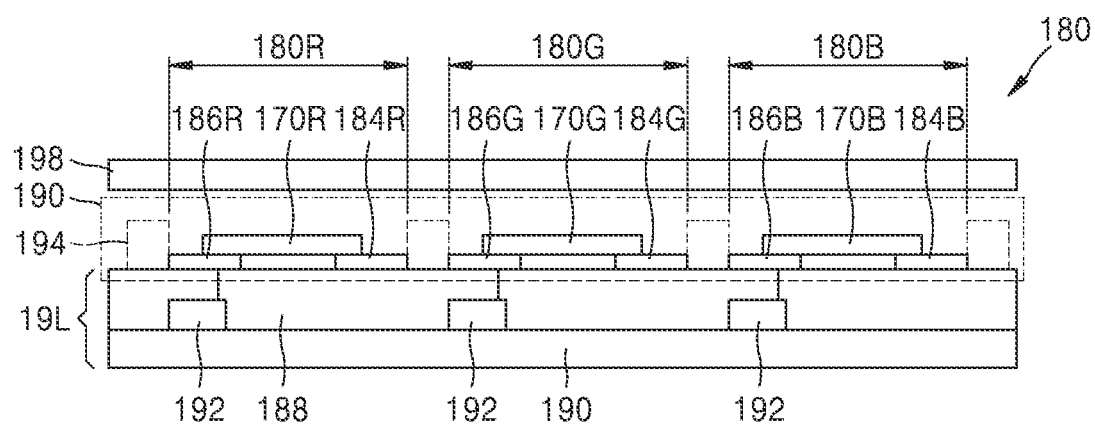
FIG. 15 is a cross-sectional view taken along a line 15-15' of FIG. 14.

FIG. 15 is a cross-sectional view taken along a line 15-15' of FIG. 14.

Referring to FIG. 15, a plurality of driving elements 192 are present on a substrate 190. In one example, the substrate 190 may include a glass substrate or a sapphire substrate, or a substrate coated with an oxide film on a silicon substrate. The plurality of driving elements 192 may be arranged to correspond one-to-one to the first to third subpixels 180R, 180G, and 180B. One driving element 192 is provided between each of the first to third subpixels 180R, 180G, and 180B and the substrate 190. The driving element 192 may be an element that drives the first to third micro-LEDs 170R, 170G, and 170B. In one example, the driving element 192 may be a thin film transistor. A drain of the thin film transistor 192 under the first subpixel 180R is connected to the first electrode 186R. A drain of the thin film transistor 192 under the second subpixel 180G is connected to the second electrode 186G. A drain of the thin film transistor 192 under the third subpixel 180B is connected to the third electrode 186B. The plurality of driving elements 192 may be provided in an array form on one or both sides around a pixel area of the substrate 190. On the substrate 190, in addition to the plurality of driving elements 192, elements for operation and control of the micro-LED display may be present. The substrate 190, the plurality of driving elements 192, and an interlayer insulating layer 188 may be collectively referred to as a backplane 19L. In an embodiment, only the substrate 190 and the plurality of driving elements 192 may be collectively referred to as a backplane. The backplane 19L may include all elements and circuits provided on the substrate 190 in addition to the plurality of driving elements 192. The plurality of driving elements 192 are covered with an interlayer insulating layer 188. A surface of the interlayer insulating layer 188 is flat, and the first to third subpixels 180R, 180G, and 180B are provided thereon. The first to third subpixels 170R, 170G, and 170B formed on the interlayer insulating layer 188 may be collectively referred to as a pixel plate 196. The pixel plate 196 may also be expressed as a pixel layer.

Accordingly, the display device 180 illustrated in FIG. 15 may include the backplane 19L and the pixel plate 196 sequentially stacked. The display device 180 may further include a transparent front panel 198 in front of the pixel plate 196. The transparent front panel 198 may include an antireflection film attached to an outer surface.

Figure 16:
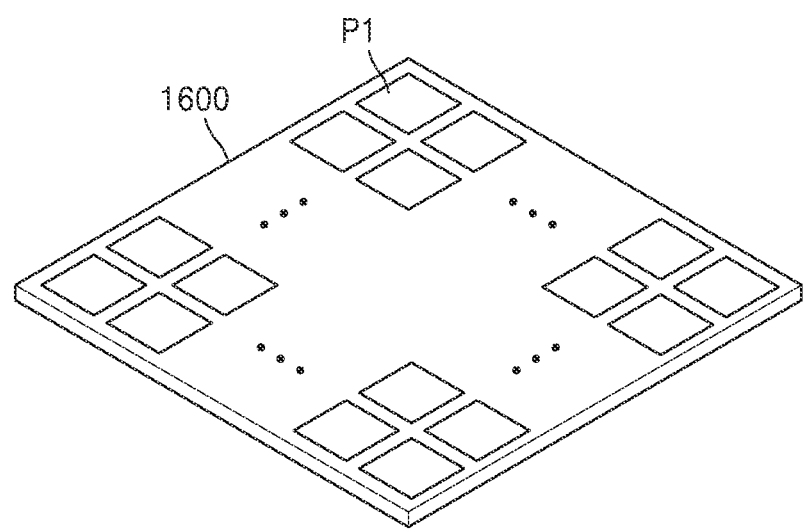
FIG. 16 is a perspective view illustrating a pixel plate including a plurality of unit pixel plates according to an embodiment.

FIG. 16 is a cross-sectional view illustrating a pixel plate 1600 including a plurality of unit pixel plates P1 according to an embodiment.

Referring to FIG. 16, the plurality of unit pixel plates P1 are arranged in the horizontal and vertical directions. Each of the unit pixel plates P1 may correspond to one pixel area. Each of the unit pixel plates P1 may be the pixel plate 196 described with reference to FIG. 15. The pixel plate 1600 may have flexibility. Accordingly, the pixel plate 1600 may be bent or folded.

Figure 17:
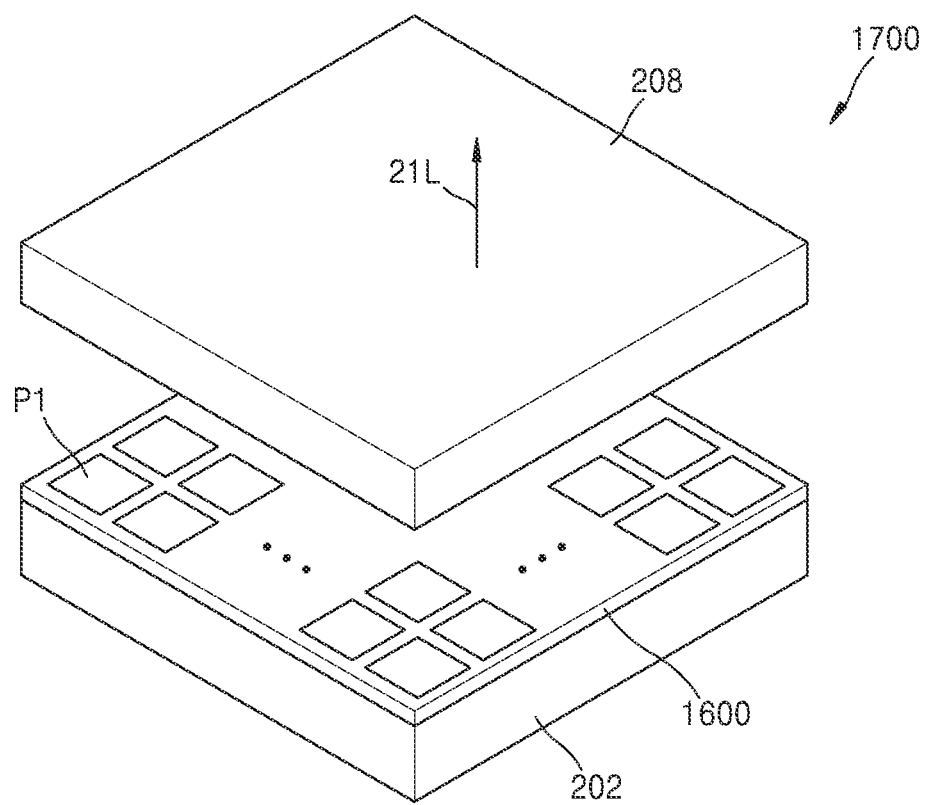
FIG. 17 is a perspective view illustrating a display device including the pixel plate of FIG. 16.

FIG. 17 is a perspective view illustrating a display device 1700 including the pixel plate 1600 of FIG. 16.

Referring to FIG. 17, the display device 1700 includes a backplane 202, the pixel plate 1600, and a transparent front panel 208. The backplane 202 may include a circuit unit in which elements for driving the display device 1700 are mounted. The circuit unit may include a semiconductor device for driving the pixel plate 1600, for example, a TFT or a capacitor. The transparent front panel 208 may include a plate that is transparent to light, and an antireflection film may be provided on a surface of the plate. The display device 1700 may be an LED display device. In another example, the display device 1700 may constitute a display area of an electronic device having an image display area or may be included in the display area. Reference numeral 21L denotes light (image) emitted through the transparent front panel 208.

Figure 18:
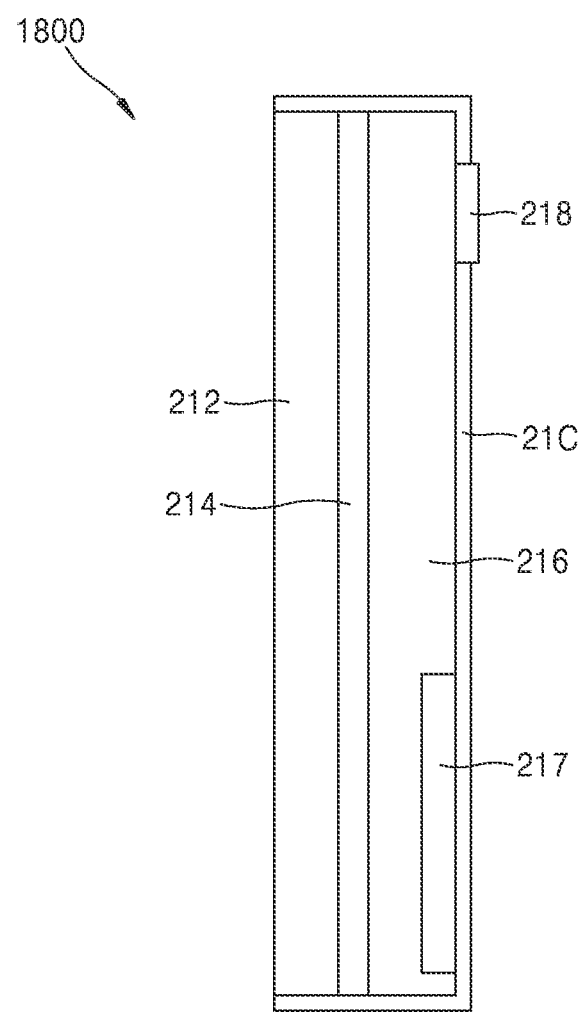
FIG. 18 is a cross-sectional view illustrating an electronic device that includes a pixel plate according to an embodiment and has a display area.

FIG. 18 is a cross-sectional view illustrating an electronic device 1800 that includes a pixel plate 214 according to an embodiment and has a display area.

The electronic device 1800 may be a portable electronic device that may be carried by a user. The electronic device 1800 include an image display area and may include a communication function. In one example, the electronic device 1800 may be a mobile phone or a tablet PC.

Referring to FIG. 18, the electronic device 1800 may include a front panel 212, the pixel plate 214, a rear panel 216, and a battery 217. An image generated through the pixel plate 214 passes through the front panel 212 and is transmitted to the user. The front panel 212 may include a transparent plate (e.g., a glass plate). The pixel plate 214 may be the pixel plate 1600 of FIG. 16. The rear panel 216 is disposed behind the pixel plate 214 and may face the front panel 212 with the pixel plate 214 therebetween. The rear panel 216 may include an element for driving the pixel plate 190 and may be a circuit board on which a module or circuit related to an overall operation and control of the electronic device 1800 is mounted, or may include the circuit board. The battery 217 may be mounted on a portion of the rear panel 216. The battery 217 is used as an operation power source for the electronic device 1800. A camera 218 is provided on a side of the rear panel 216. Reference numeral 21C denotes a case that surrounds and protects a portion of the front panel 212 and the pixel plate 214 and the rear panel 216.

Figure 19:
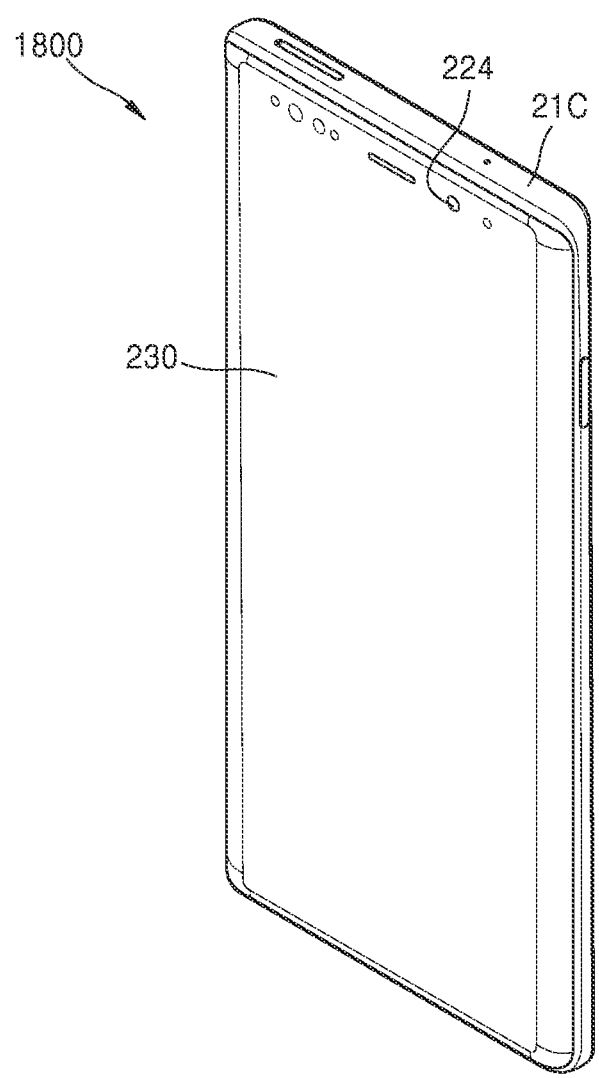
FIG. 19 is a perspective view of the electronic device of FIG. 18 when the electronic device is a mobile phone.

FIG. 19 is a perspective view of the electronic device 1800 of FIG. 18 when the electronic device 1800 is a mobile phone.

Referring to FIG. 19, the electronic device 1800 has a display area 230 on a front side thereof. The display area 230 may be at least a part of a front surface of the front panel 212. Reference numeral 224 denotes a front camera disposed above the display area 230.

Figure 20:
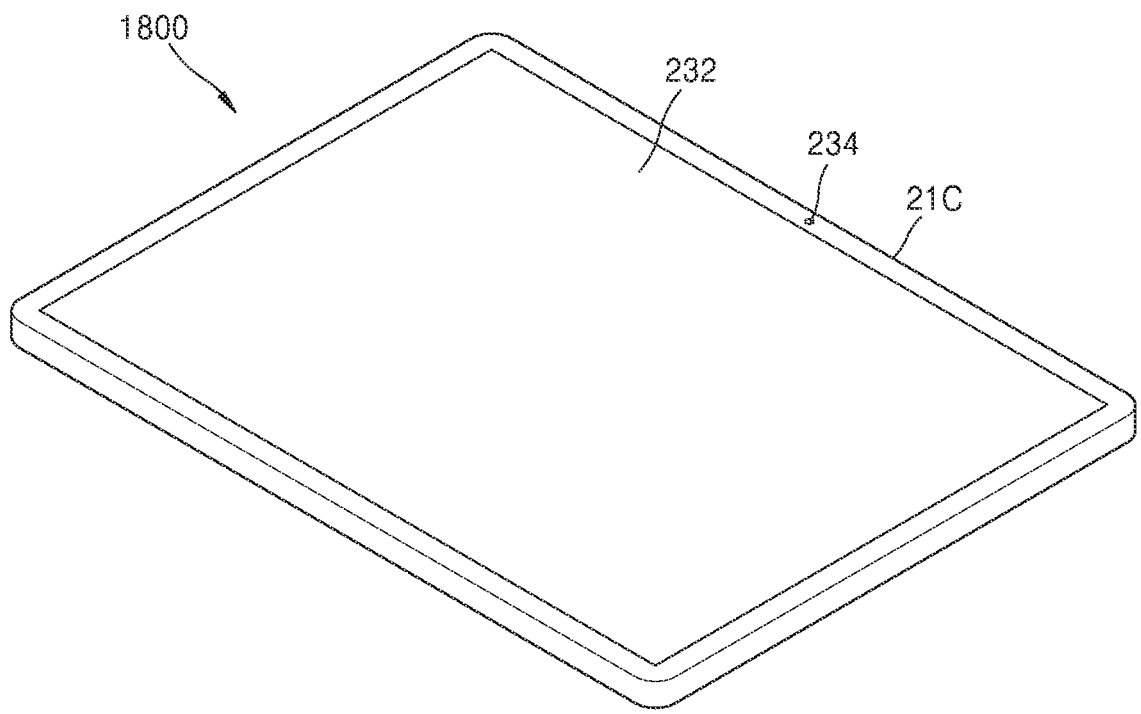
FIG. 20 is a perspective view of the electronic device of FIG. 18 when the electronic device is a tablet PC.

FIG. 20 is a perspective view of the electronic device 1800 of FIG. 18 when the electronic device 1800 is a tablet PC.

Reference numeral 232 denotes an area in which an image is displayed. A front camera 234 is provided above the display area 232.

Figure 21:
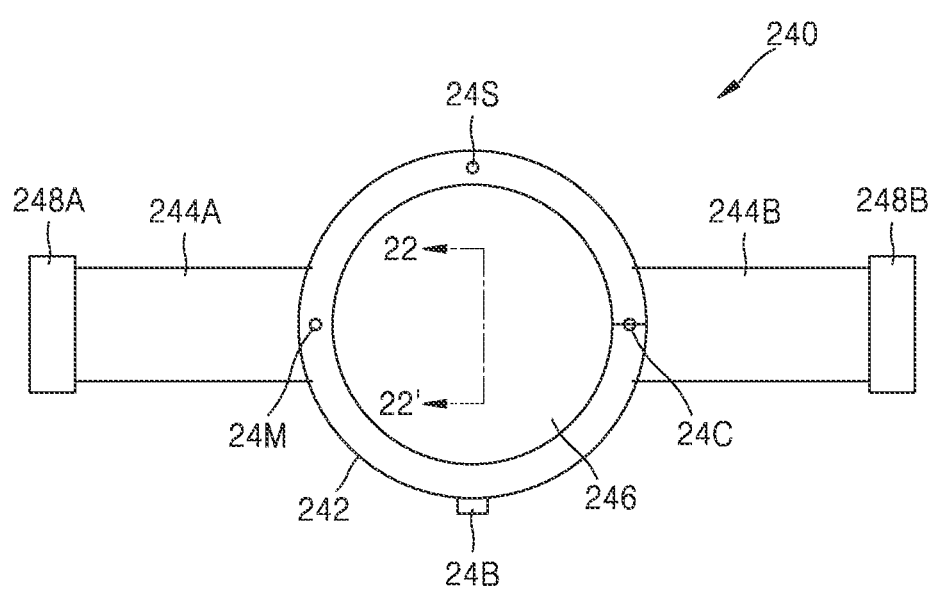
FIG. 21 is a plan view illustrating a smart watch as an example of an electronic device including a pixel plate according to an embodiment.

FIG. 21 is a plan view illustrating a smart watch 240 as an example of an electronic device including a pixel plate according to an embodiment.

The smart watch 240 is worn on a wrist and may be a type of electronic device that provides various functions (e.g., a biosignal measurement function, an Internet connection function, etc.) in addition to a watch and a communication function.

Referring to FIG. 21, the smart watch 240 may include a main body 242 having a display area 246 and first and second bands 244A and 244B that are connected to both sides of the main body 242, respectively, and are used to attach the main body 242 to a wrist. The main body 242 itself may be referred to as a smart watch. The main body 242 is illustrated in a circular shape for convenience, but may be non-circular shape, for example, a square shape. An operation state and/or an operation mode of the smart watch 240 may be displayed in the display area 246, and an image may also be displayed in the display area 246. Selection and control of an operation mode of the smart watch 240 may be performed by touching a menu displayed on the display area 246, or by using a function selection controller 24B provided on a circumference of the main body 242. A camera 24C, a microphone 24M, and a speaker 24S are provided around the display area 246 of the main body 242. The locations of the camera 24C, the microphone 24M, and the speaker 24S are relative and may vary, and are not limited to those shown in the drawings. A first coupling unit 248A is provided at an end of the first band 244A connected to one side of the main body 242. A second coupling unit 248B is provided at an end of the second band 244B connected to the other side of the main body 242. When the smart watch 240 is worn on a wrist, the first and second coupling units 248A and 248B may be coupled to each other.

Figure 22:
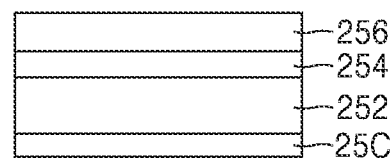
FIG. 22 is a cross-sectional view taken along a line 22-22' of FIG. 21.

FIG. 22 is a cross-sectional view taken along a line 22-22' of FIG. 21.

Referring to FIG. 22, a rear panel 252, a pixel plate 254, and a front panel 256 are sequentially stacked on a case 25C. The case 25C may be a lower case of the main body 242. The rear panel 252 may be a circuit unit (e.g., a circuit board) responsible for overall operation and control of the main body 242 and driving and control of the pixel plate 254 or may include the circuit unit. The pixel plate 254 may be the pixel plate 1600 shown in FIG. 16 or may include the pixel plate 1600. The front panel 256 may include a plate that is transparent to light.

The nanorod type micro-LED described above may be used in various display devices as well as LED display devices. In the disclosed nanorod type micro-LED, an entire side surface thereof through which light is emitted is covered with a material layer, and the refractive index of the material layer is less than that of a semiconductor layer including an active layer (light emitting layer) and greater than that of air. When the material layer is provided on the side surface of the nanorod type micro-LED, a gradient of a refractive index between the semiconductor layer and air may be reduced. In this way, as the refractive index gradient between the semiconductor layer and the air is reduced, the total internal reflection angle of light emitted through the side surface of a nanorod type micro-LED from an inside of the semiconductor layer may increase, and as a result, light emitted through the side surface of the nanorod type micro-LED may increase. Accordingly, when the disclosed nanorod type micro-LED is used, light extraction efficiency or light emission efficiency may be increased. Therefore, in the case of an electronic device using the disclosed nanorod type micro-LED as a component of a pixel, a further brighter and clear image may be expressed with relatively low power.

It may be understood that embodiments described herein may be considered in a descriptive sense only and not for purposes of limitation. Descriptions of features or aspects within each embodiment may be considered as available for other similar features or aspects in other embodiments. While the embodiments have been described with reference to the figures, it will be understood by those of ordinary skill in the art that various changes in form and details may be made therein without departing from the spirit and scope as defined by the following claims.

What is claimed is:

1. A nanorod type micro-light emitting diode (LED) comprising:
   a nanorod stack structure comprising a first semiconductor layer, a multi-quantum well layer, a second semiconductor layer, and an electrode layer sequentially stacked in a vertical direction and emitting light from a side surface of the nanorod stack structure, the side surface facing a horizontal direction perpendicular to the vertical direction, wherein each of a side surface of the electrode layer and a side surface of the second semiconductor layer extends in the vertical direction, and the side surface of the electrode layer is in line with the side surface of the second semiconductor layer; and
   a functional material layer configured to cover the side surface of the nanorod stack structure and to enhance the light emission through the side surface of the nanorod stack structure by increasing a total internal reflection angle of the nanorod stack structure,
   wherein the functional material layer is in contact with the side surface of the electrode layer and has a refractive index between a refractive index of the nanorod stack structure and a refractive index of air, and comprises a plurality of material layers having a refractive index distribution in which a refractive index decreases as a distance from the side surface of the nanorod stack structure increases.

2. The nanorod type micro-LED of claim 1, wherein the functional material layer comprises a dielectric layer.

3. The nanorod type micro-LED of claim 1, wherein the plurality of material layers comprise first to n-th material layers sequentially stacked in the horizontal direction perpendicular to the side surface of the nanorod stack structure.

4. The nanorod type micro-LED of claim 3, wherein the first to n-th particle layers comprise particles of a same material, and
   the first to n-th particle layers have a particle distribution in which a size of the particles increases as the distance from the side surface increases.

5. The nanorod type micro-LED of claim 1, wherein the first semiconductor layer is an n-type semiconductor layer disposed on one side of the multi-quantum well layer,
   the second semiconductor layer is a p-type semiconductor layer disposed on another side of the multi-quantum well layer, and
   the n-type semiconductor layer faces the p-type semiconductor layer.

6. The nanorod type micro-LED of claim 1, wherein the plurality of material layers comprise first to n-th particle layers sequentially stacked in the horizontal direction perpendicular to the side surface of the nanorod stack structure.

7. The nanorod type micro-LED of claim 6, wherein the first to n-th particle layers comprise nanoparticles having a same size.

8. The nanorod type micro-LED of claim 1, wherein the multi-quantum well layer is disposed between the first semiconductor layer and the second semiconductor layer, and
   wherein the nanorod stack structure further comprises a first barrier layer provided above the multi-quantum well layer, disposed between the electrode layer and the multi-quantum well layer and having a through hole located above a central region of the multi-quantum well layer.

9. The nanorod type micro-LED of claim 8, wherein the nanorod stack structure further comprises a second barrier layer provided below the multi-quantum well layer and having a through hole located below the central region of the multi-quantum well layer.

* * * * *